United States Patent [19]

Luryi et al.

[11] Patent Number: 4,999,843
[45] Date of Patent: Mar. 12, 1991

[54] VERTICAL SEMICONDUCTOR LASER WITH LATERAL ELECTRODE CONTACT

[75] Inventors: Sergey Luryi, Bridgewater; Ya-Hong Xie, Flemington, both of N.J.

[73] Assignee: AT&T Bell Laboratories, Murray Hill, N.J.

[21] Appl. No.: 462,244

[22] Filed: Jan. 9, 1990

[51] Int. Cl.⁵ .................................................. H01S 3/19
[52] U.S. Cl. ........................................ 372/45; 357/4; 357/7; 372/99
[58] Field of Search ................ 372/43, 44, 45, 99; 357/17, 4

[56] References Cited

FOREIGN PATENT DOCUMENTS

| | | | |
|---|---|---|---|
| 0081887 | 5/1985 | Japan | 372/45 |
| 0081888 | 5/1985 | Japan | 372/45 |
| 0214493 | 9/1986 | Japan | 372/45 |
| 0086883 | 4/1987 | Japan | 372/45 |
| 0044086 | 2/1989 | Japan | 372/45 |
| 0094689 | 4/1989 | Japan | 372/45 |

*Primary Examiner*—Georgia Epps
*Attorney, Agent, or Firm*—D. I. Caplan

[57] ABSTRACT

A vertical laser is typically formed by successive horizontal layers, epitaxially grown on a substrate, suitable for forming a bottom mirror, a bottom cladding layer, an active region, a top cladding layer, and a top mirror. In prior art, one of a pair of electrodes for enabling electrical pumping the laser—the "top" electrode—is attached to the top surface of the top mirror, whereby undesirably large amounts of heat are generated because of the relatively high impedance of the top mirror. To reduce this heat generation, the laser is redesigned to enable the top electrode to make lateral contact with the top cladding layer, whereby the impedance and hence the power loss are reduced.

9 Claims, 1 Drawing Sheet

4,999,843

VERTICAL SEMICONDUCTOR LASER WITH LATERAL ELECTRODE CONTACT

TECHNICAL FIELD

This invention relates to electrically pumped semiconductor lasers and more particulary to those which emit light through a major ("horizontal") surface of the semiconductor and which are known as "vertical (cavity)" or "surface (emitting)" lasers

BACKGROUND OF THE INVENTION

In prior art, the structures of electrically pumped semiconductor lasers fall into two main categories: (1) "edge emitting"(or simply "edge") lasers and (2) "surface emitting" (or simply "surface") or vertical lasers. Both have an active region which typically comprises a planar pn junction. Typically the plane of this pn junction is parallel to a major surface of a semiconductor body, the major surface being considered somewhat arbitrarily to be horizontal. In an edge laser, light is emitted from one (or more) side edge(s) of the semiconductor, an optical cavity in the semiconductor being created in the semiconductor body by virtue of semi-reflecting optical mirror(s) located on the side edge(s). In a vertical laser, light is emitted from the top or the bottom (major) surface, or both, of the semiconductor, and optical cavity being created therein by virtue of semi-reflecting optical mirror(s) located on the top or bottom surface thereof, or both. Vertical lasers appear to be more attractive from the standpoint of not requiring the more difficult control over the side edge contours as is required in the case of horizontal lasers.

Typically, in a vertical laser each of the mirrors is formed by a quarter-wavelength-stack, such as a stack formed by a semiconductor superlattice. A vertical laser can be built as a double heterostructure, for example, by successive epitaxial growth of the follwing semiconductor layers in spatial sequence upon a semiconductor substrate: the bottom mirror, a bottom optical cladding region, the active region, a top cladding region, and the top mirror. A top electrode is then formed on the top major surface of the top mirror, for electrical access. Many such vertical lasers can be built simultaneously on a single such substrate in such a way that the amount of light—e.g., ON vs. OFF—emitted by each laser can be controlled by an electrical signal independently of all other lasers on the substrate. Thus vertical lasers appear especially attractive for use in practical applications where more than one independently controllable source of light is desired. Typically the amount of light emitted by each such vertical laser is determined by the electrical current injected into the laser through the top electrode.

In prior art, during operation a vertical laser suffers from undesirably large amounts of heat generation, whereby the efficiency and lifetime of the laser are undesirably low. Therefore it would be desirable to have a vertical laser in which the heat generation is reduced.

SUMMARY OF THE INVENTION

The heat generation in a vertical semiconductor laser is reduced by attaching the top electrode directly to a peripheral (ring) portion of the top cladding region. That is, the top electrode penetrates down into direct contact with a peripheral portion of the top cladding region. During laser operation, electrical current is injected laterally by the top electrode into the top cladding region and hence into the active region, instead of being confined to injection vertically downwards through the top mirror (relatively high series resistance) and through the top cladding region before entering into the active region as in prior art.

BRIEF DESCRIPTION OF THE DRAWING

This invention together with its features, characteristics, and advantages can be better understood from the following Detailed Description when read in conjunction in which the FIGURE depicts a cross section of a vertical laser in accordance with an illustrative embodiment of the invention. Only for the purpose of clarity, the FIGURE is not drawn to any scale.

DETAILED DESCRIPTION

Figure 1:
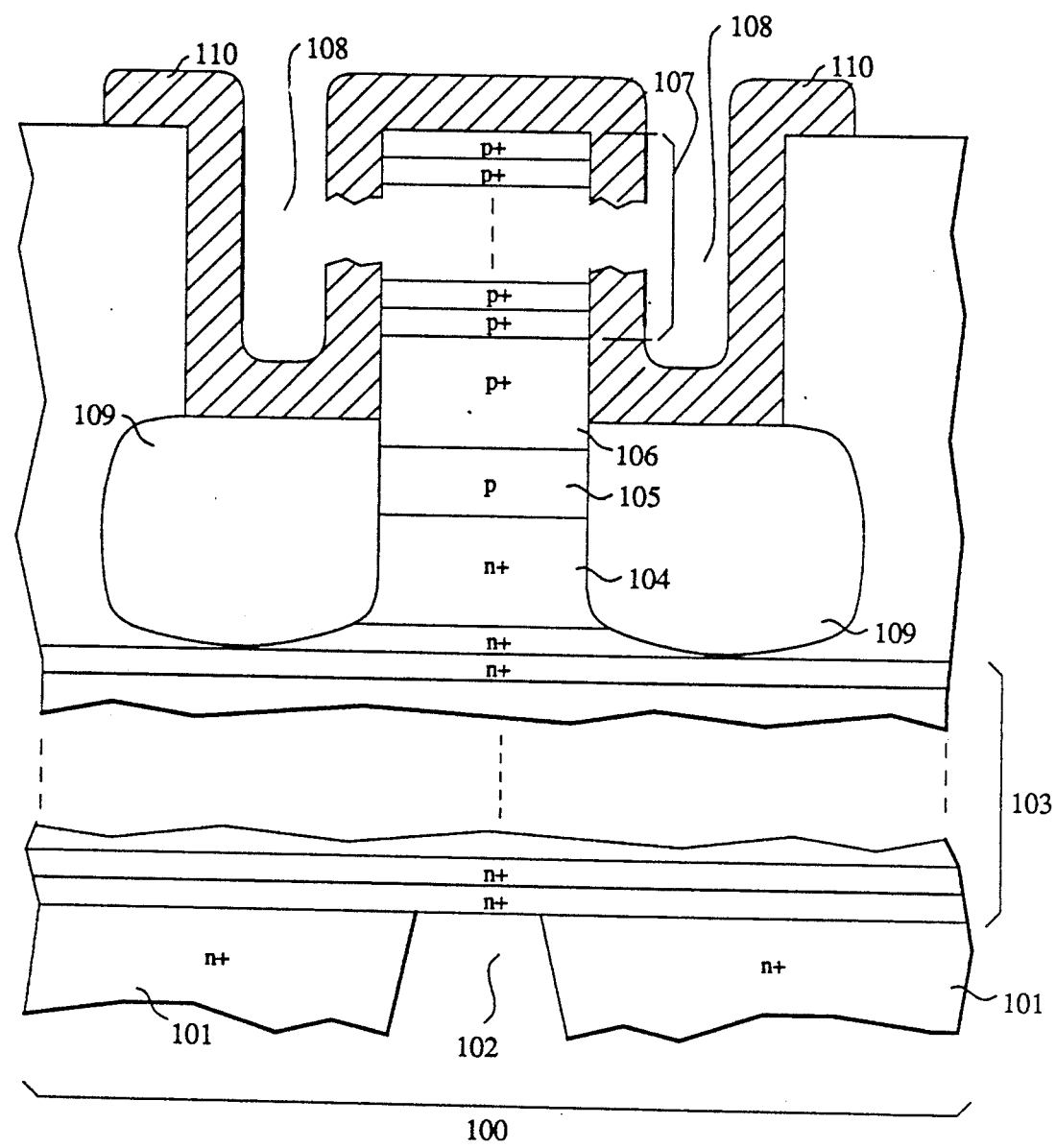

As shown in the FIGURE, a vertical (double-heterostructure) laser 100, suitable for emitting light having a wavelength of approximately 0.87 $\mu$m in accordance with an illustrative embodiment of the invention includes a substrate 101 of n+ gallium arsenide into which a light exit hole 102 has been etched to enable the light (optical radiation) generated in the laser 100 to exit therefrom. Upon the substrate 101 has been successively grown—typically by molecular beam epitaxy—approximately 20 periods of approximately 0.060 $\mu$m thick $n^+(Al_{0.1}Ga_{0.9}As)$/approximately 0.070 $\mu$m thick $n^+(AlAs)$, to form a bottom superlattice 103. Each layer of the superlattice thus has a thickness of one-quarter wavelength as measured in the layer. Such a superlattice acts as a bottom specular reflecting light mirror (stack), which reflects approximately 99% of normally incident light in the laser. Upon the bottom superlattice 103 is located and n+(bottom) cladding layer 104 of $Al_{0.3}Ga_{0.7}As$, typically 1.0 $\mu$m thick with an impurity doping level of approximately $5 \times 10^{18}$ impurity ions per cubic centimeter. Upon the n+ cladding layer 104 is located in succession: a p type active region 105, a p+(top) type cladding layer 106, and a p+(top) superlattice 107, also containing approximately 20 periods.

More specifically, the active region 105 comprises a p type gallium arsenide layer having an impurity doping concentration in the range of typically approximately 1E15 to 1E16 per cubic centimeter and a thickness of typically approximately 0.5 $\mu$m. The p+(top) cladding layer 106 comprises a layer p+ of $Al_{0.3}Ga_{0.7}As$ having an impurity doping concentration of typically approximately 1E19 per cubic centimeter and a thickness of typically approximately 1.0 $\mu$m. The p+ superlattice 107, which also acts as a 99% specularly reflecting mirror (stack), contains alternating layers of $p^+Al_{0.1}Ga_{0.9}As$, each having a thickness typically of approximately 0.060 $\mu$m, and p+AlAs, each having a thickness of typically approximately 0.070 $\mu$m.

The layers 103,104,105,105, and 107 can all be grown by molecular beam epitaxy. Thereafter, as by conventional masking and wet etching with an aqueous mixture of phosphoric acid and hydrogen peroxide, a vertical trench 108 is etched, followed by an ion implantation with Oxygen, (O$^-$) and hydrogen (H$^+$) ions into the masked structure to produce a semi-insulating region 109. Advantageously the etching of the trench 108 is allowed to proceed for a time sufficient for the bottom of the trench to penetrate down along the sidewall of the top cladding layer 106 to a position just above the top of the active region 105. Then a top electrode layer 110 of electrically conductive material, such as gold-beryllium alloy overlaid with gold is deposited for making ohmic contact with the p+superlattice 107 and for supplying a means for external contact therewith. Typically, as viewed from above, the trench 108 is annular shaped, and the p+mirror 107 is circular shaped, but other shapes can be used.

It should be understood that the underside of the substrate 101 also is supplied with an ohmic contact electrode (not shown), typically made of gold-germanium-nickel, as known in the art.

The semi-insulating region 109 serves to force the electrical current supplied by the electrode to be injected serially into the top cladding layer 106 and the active region 105, as is desired in a vertical laser.

During laser operation, a voltage is applied to the electrode layer 110 which produce a forward bias across the pn junction between layers 105 and 104. The light generated in the active region 105 finds itself in a highly reflecting Fabry-Perot cavity formed by the p+mirror 107 and the n+mirror 103, and at the same time the undesirable relatively high electrical resistance of the p+superlattice 107 is substantially bypassed by the penetration of the top electrode layer 110 into the trench. Thus this top electrode 110, which laterally contacts the p+cladding layer 106 at a peripheral portion thereof, supplies an external low resistive access thereto and hence to the active region 105; whereby the overall electrical resistance and hence heat generation of the laser 100 is reduced.

Although the invention has been described in terms of a specific embodiment various modifications can be made without departing from the scope of the invention. For example, p and n type materials can all be interchanged. Moreover, other III-V compound semiconductors can be used, such as InP/InGaAs. Also, the portion of the electrode 110 located on the top surface of the p+mirror 107 can be omitted or can have an aperture therein, so that optical radiation can be emitted by the laser 100 through the top surface of the p+mirror 107 in addition to the bottom surface of the n+mirror 103. Finally, instead of double heterojunction structures, other structures can be used, such as multiple quantum wells.

We claim:

1. In a vertical semiconductor laser
   (a) an optically active region located in a semiconductor body;
   (b) a top optical cladding layer located on top of the optically active region;
   (c) a top mirror located on the top surface of the top cladding layer
   (d) a top electrode contacting a peripheral portion of the top cladding layer.

2. The laser of claim 1 further comprising a bottom cladding layer located on the bottom surface of the active region.

3. The laser of claim 2 further comprising a bottom mirror located on the bottom surface of the bottom cladding layer.

4. The laser of claim 3 in which the top mirror is formed by a semiconductor superlattice stack.

5. The laser of claim 4 which further comprises a semiconductor substrate having a top major surface upon which the bottom mirror is located.

6. The laser of claim 3 in which the bottom mirror is formed by a semiconductor superlattice stack.

7. The laser of claim 6 in which the bottom mirror, the bottom cladding layer, the active region, the top cladding layer, and the top mirror have been successively epitaxially grown upon a top surface of a semiconductor substrate.

8. The laser of claim 1 which further comprises a semi-insulating layer located on a sidewall of the active region.

9. The laser of claim 2 which further comprises a semi-insulating layer located on a sidewal of the active region.

* * * * *